(12) United States Patent
Main et al.

(10) Patent No.: US 6,965,653 B2
(45) Date of Patent: Nov. 15, 2005

(54) CIRCUIT AND METHOD FOR PROCESSING AN AUTOMATIC FREQUENCY CONTROL SIGNAL

(75) Inventors: William Eric Main, Mesa, AZ (US); Danielle L. Coffing, Tempe, AZ (US); Klaas Wortel, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 863 days.

(21) Appl. No.: 09/746,277

(22) Filed: Dec. 21, 2000

(65) Prior Publication Data

US 2002/0080897 A1 Jun. 27, 2002

(51) Int. Cl.[7] ............................................. H04L 27/06
(52) U.S. Cl. ...................... 375/344; 375/132; 375/202; 455/181.1; 455/208; 455/265
(58) Field of Search ...................... 331/10, 172, 44, 331/2, 65, 57, 111, 27; 323/315; 329/324, 329/301, 308; 455/182.2, 75, 255, 180.1, 455/208, 265; 375/375, 344, 332, 226, 345, 375/321, 316, 232, 326, 202, 132; 348/726, 348/735; 327/65, 530; 381/15

(56) References Cited

U.S. PATENT DOCUMENTS

| | | | | |
|---|---|---|---|---|
| 3,764,917 A | * | 10/1973 | Rhee | .......................... 455/208 |
| 4,208,741 A | * | 6/1980 | Brun et al. | ............... 455/180.1 |
| 4,247,834 A | | 1/1981 | Brun et al. | |
| 4,267,602 A | * | 5/1981 | Brun et al. | ............... 455/182.2 |
| 4,277,695 A | | 7/1981 | Wilber et al. | |
| 4,370,520 A | * | 1/1983 | Malchow | ...................... 381/15 |
| 4,578,594 A | * | 3/1986 | Santos | ......................... 327/530 |
| 5,382,921 A | | 1/1995 | Estrada et al. | |
| 5,463,353 A | | 10/1995 | Countryman et al. | |
| 5,500,878 A | * | 3/1996 | Iwasaki | ...................... 375/344 |
| 5,650,749 A | * | 7/1997 | Main | .......................... 329/324 |
| 5,703,478 A | * | 12/1997 | Main | .......................... 323/315 |
| 6,023,491 A | * | 2/2000 | Saka et al. | ................... 375/326 |
| 6,121,847 A | * | 9/2000 | Katznelson et al. | ........... 331/44 |
| 6,133,802 A | | 10/2000 | Ma | |
| 6,369,659 B1 | * | 4/2002 | Delzer et al. | .................. 331/10 |

FOREIGN PATENT DOCUMENTS

| | | |
|---|---|---|
| EP | 1 093 227 A1 | 4/2001 |
| JP | 57041018 | 6/1982 |

OTHER PUBLICATIONS

PCT/US01/49444 PCT Search Report mailed Nov. 7, 2002.

* cited by examiner

*Primary Examiner*—Shuwang Liu
(74) *Attorney, Agent, or Firm*—Robert L. King

(57) ABSTRACT

An integrated demodulator tuning circuit (10, 60) receives differential currents at input terminals (12, 46) and provides an AFC signal at an output terminal (48). The AFC current characteristic has a dead band (72) in the output current generated when the integrated demodulator tuning circuit (10, 60) operates under the condition where the difference between the currents supplied at the input terminals (12 and 46) is at or below a set threshold value. The set threshold value is determined by the relative sizes of the transistors (14, 16 and 20, 36, 38 and 40) that form the current mirrors connected to the input terminals (12, 46).

21 Claims, 2 Drawing Sheets

CIRCUIT AND METHOD FOR PROCESSING AN AUTOMATIC FREQUENCY CONTROL SIGNAL

TECHNICAL FIELD OF THE INVENTION

This invention is related, in general, to signal conversion and, more specifically, to circuitry for signal conversion using an Automatic Frequency Control (AFC) signal.

BACKGROUND OF THE INVENTION

Portable communication products require circuits that can perform well in a low power environment. A reduction of power supply voltages allows for fewer battery cells, reducing the size and weight of the portable equipment. However, the lower power constraint adversely affects the performance of the standard RF circuitry. Circuits are needed that can achieve the design goals for noise figure, linearity and power consumption for portable communications products.

In a two-way communication link, the transmit signal must be differentiated from the desired signal to be received. The received signal is passed through circuits that include low-noise amplifiers and mixers for down-converting the received signal in frequency from the Radio Frequency (RF) range to the Intermediate Frequency (IF) range. The mixer generates an output signal having a frequency that is the difference between the frequency of the received RF signal and the frequency of a local oscillator signal, thus converting the received signal to an IF signal.

The performance of filtering, frequency conversion and demodulation is sensitive to IC processing. The purpose of the receiver is to receive and process a signal while accounting for variations that affect frequency and tuning accuracy. An Automatic Frequency Control (AFC) signal is provided to adjust the receiver frequency demodulation process and accommodate operating power supply changes and component variations due to temperature and process. Typically, the AFC signal charges an external capacitor used by the tuning circuit for filtering. This capacitor value is large to prevent the oscillator from following the modulation signals and cancelling them. However, the large capacitance value limits the tuning speed of the AFC.

Accordingly, a need exists for a receiver that generates an AFC signal that has a fast operation. It would be a competitive advantage to provide a receiver that eliminated external components.

DETAILED DESCRIPTION OF THE DRAWINGS

Figure 1:
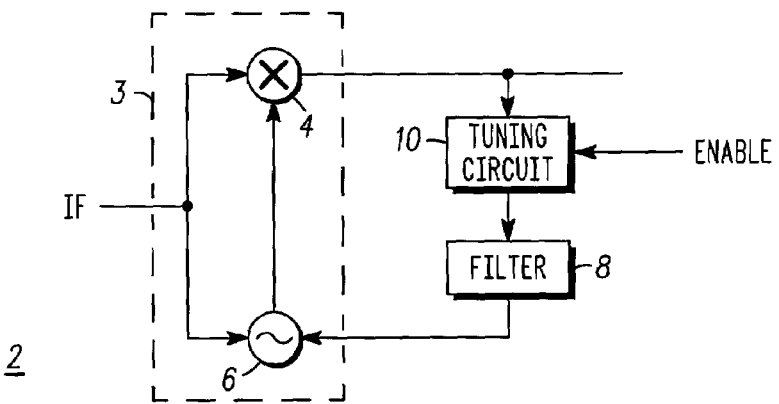
FIG. 1 is a block diagram of an integrated demodulator that receives an Automatic Frequency Control (AFC) signal in accordance with the present invention.

FIG. 1 is a block diagram of an integrated injection-locked demodulator circuit 2 that generates an Automatic Frequency Control (AFC) signal in accordance with the present invention. Injection-locked demodulator circuit 2 includes an injection-locked oscillator 6 and a phase detector 4, both receiving an input signal IF. It should be noted that both phase detector 4 and injection-locked oscillator 6 in circuit 3 receive the modulated signal IF. Injection-locked oscillator 6 generates an output signal to phase detector 4 that has a quadrature relationship to the received signal IF. The output signal generated by phase detector 4 is supplied to a tuning circuit 10 that generates an output signal for controlling the charge on a capacitor in low pass filter 8. The output signal from filter 8, i.e., the AFC signal, is fed back to oscillator 6 and provides control over the frequency of the oscillator. Although shown in FIG. 1 as a single line that connects demodulator circuit 3 to tuning circuit 10, it should be understood that either a single-ended or differential signal could be provided.

In general, if the AFC made the oscillator follow low frequency modulation signals it would cancel them. To avoid this, prior art demodulators have used a very large capacitor to give a very low frequency pole in the AFC filter. In some applications, especially time division duplex systems where transceivers must switch quickly back and forth between transmit and receive, fast tuning is required and the large capacitor is not an option. In the present invention, the demodulator portion is comprised of an injection-locked oscillator 6 and a phase detector 4 that compare the phase of the oscillator to that of the injected input signal. The demodulated output signal is also filtered and used for AFC where it adjusts the oscillator frequency so that the average value of the output signal is zero.

Integrated injection-locked demodulator circuit 2 uses a small capacitor that is small enough to be integrated on a semiconductor chip. Disabling the AFC either by separating the tuning and decoding functions in time or tuning only when the oscillator is off tune allows the use of a small capacitor. Thus, when demodulator circuit 2 receives data in the modulated signal, the AFC signal generated by tuning circuit 10 is disabled. However, when data is not received in the modulated signal, the AFC signal is enabled to tune oscillator 6 to the input carrier frequency.

Figure 2:
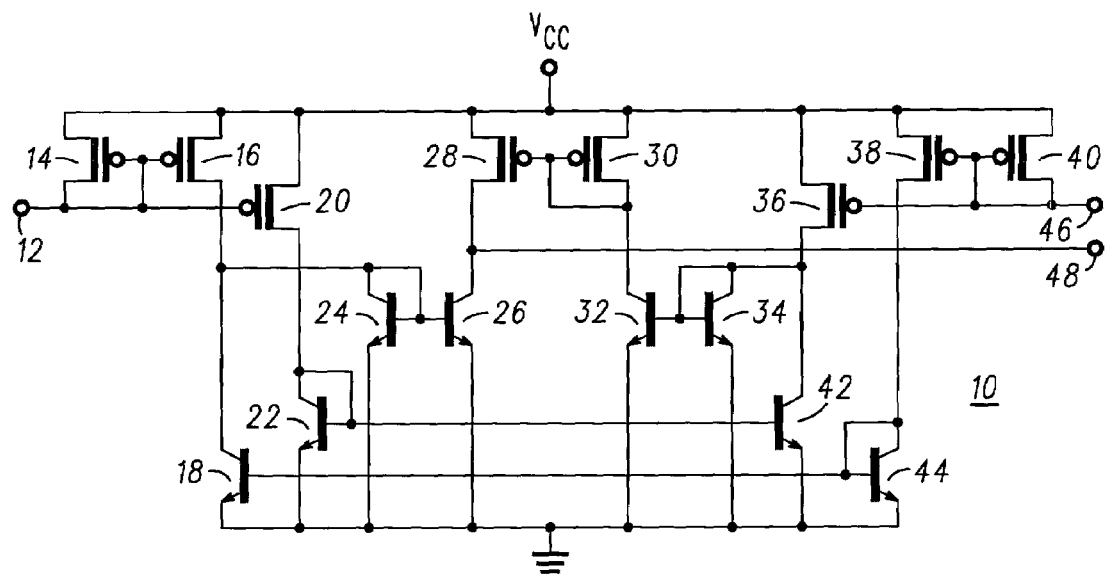
FIG. 2 is a circuit diagram of one embodiment of an integrated demodulator tuning circuit.

FIG. 2 is a circuit diagram showing one embodiment of integrated demodulator tuning circuit 10 that generates an AFC signal provided at an output terminal 48. The same reference numbers are used in the figures to denote the same elements. Demodulator tuning circuit 10 can be used for personal communications service or in a cellular phone, among others. Although P-channel MOSFETs and NPN transistors are shown in the figures, an alternate embodiment could use PNP transistors and N-channel MOSFET devices. A differential input current is received at input terminals 12 and 46 and an output current that is a function of the difference in input currents is provided at output terminal 48. The current received at input terminal 12 is mirrored in transistors 14 and 16 and again mirrored in transistors 24 and 26. Transistors 14 and 16 are P-channel devices having commonly connected gate terminals that further connect to input terminal 12. The source terminals of transistors 14 and 16 are connected to a power conductor for receiving an operating voltage $V_{CC}$. The drain terminal of transistor 14 is connected to input terminal 12. Transistors 24 and 26 are NPN transistors having commonly connected base terminals that further connect to the collector of transistor 24 and to the drain terminal of transistor 16. The emitter terminals of transistors 24 and 26 are connected to a power conductor for receiving an operating voltage such as ground. Thus, transistors 14 and 16, and 24 and 26 are configured to provide a current path from input terminal 12 to output terminal 48.

Transistors 36 and 40 are P-channel devices having commonly connected gate terminals that further connect to input terminal 46. The source terminals of transistors 36 and 40 are connected to the power conductor for receiving the operating voltage $V_{CC}$. The drain terminal of transistor 40 is connected to input terminal 46. Transistors 32 and 34 are NPN transistors having commonly connected base terminals that further connect to the collector of transistor 34 and to the drain terminal of transistor 36. The emitter terminals of transistors 32 and 34 are connected to a power conductor for receiving the ground operating voltage. Transistors 28 and 30 are P-channel devices having commonly connected gate terminals that further connect to the drain of transistor 30 and the collector of transistor 32. The source terminals of transistors 28 and 30 are connected to the power conductor for receiving the operating voltage $V_{CC}$. The drain terminal of transistor 28 is connected to the collector terminal of transistor 26 and to output terminal 48. Thus, current mirrors formed by transistors 40 and 36, 32 and 34, and 30 and 28 are configured to provide a current path from input terminal 46 to output terminal 48.

Demodulator tuning circuit 10 further includes a P-channel transistor 20 having a gate terminal connected to input terminal 12 and a source terminal connected to the power conductor for receiving the operating voltage $V_{CC}$. The drain of transistor 20 is commonly connected to the base terminals of transistors 22 and 42 and further connected to the collector terminal of transistor 22. The emitter terminals of transistors 22 and 42 are connected to the power conductor that receives the ground operating voltage. The collector terminal of transistor 42 is connected to the drain terminal of transistor 36. A P-channel transistor 38 has a gate terminal connected to input terminal 46, a source terminal connected to the power conductor for receiving the operating voltage $V_{CC}$ and a drain terminal connected to the collector terminal of a transistor 44. Transistors 18 and 44 are NPN transistors having commonly connected base terminals that are further connected to the collector terminal of transistor 44. The emitter terminals of transistors 18 and 44 are connected to the power conductor that receives the ground operating voltage. The collector terminal of transistor 18 is connected to the drain terminal of transistor 16. It should be noted that this embodiment of demodulator tuning circuit 10 does not include an additional input as shown in FIG. 1.

Figure 3:
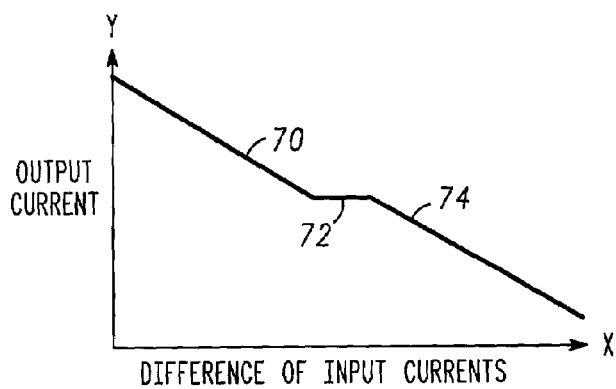
FIG. 3 is a plot of the difference in currents supplied at the output terminals versus the current at the input terminal of the integrated demodulator tuning circuit shown in FIG. 2.

FIG. 3 is a plot of the difference in currents at input terminals 12 and 46 and the corresponding current supplied at output terminal 48 of the integrated demodulator tuning circuit 10. The x-axis represents the difference in currents supplied at input terminals 12 and 46 and the y-axis represents the current provided at output terminal 48 in response to the differential input currents. Specifically, line 70 represents the current at output terminal 48 with integrated demodulator tuning circuit 10 operating under the condition where the difference between the currents supplied at terminals 12 and 46 has a value that is above a "set threshold value", and in addition, the current supplied at input terminal 12 is greater than the value of the current supplied at input terminal 46.

Line 72 shows a dead band in the output current of integrated demodulator tuning circuit 10 operating under the condition where the difference between the currents supplied at terminals 12 and 46 is either at or below the "set threshold value". It should be noted that the mid-point on line 72 represents the condition where the currents supplied at terminals 12 and 46 are the same, and therefore, the difference in the input currents is zero. The two end points of line 72 indicate the "set threshold value" as determined by the sizing of transistors 14, 16, 20, 36, 38 and 40. Specifically, one end point of line 72 is determined by the relative sizes of transistors 14, 16 and 20, and the other end point is determined by the relative sizes of transistors 36, 38 and 40. By way of example, transistors 20 and 38 are sized with a ratio of about sixteen and transistors 16 and 36 are sized with a ratio of about fourteen. Again, the "set threshold value" is set by design and determined by the relative geometric sizes of transistors 14, 16, 20, 36, 38 and 40 (see FIG. 2).

As mentioned, the dead band in the output current is generated by appropriately sizing selected devices in demodulator tuning circuit 10. With equal currents supplied at input terminals 12 and 46, the current sinking capabilities of transistors 18 and 42 should be greater than the current sourcing capabilities of transistors 16 and 36. As an alternate to sizing transistors 14, 16, 20, 36, 38 and 40, transistor 18 could be sized to conduct a current greater than the current conducted by transistor 44 and transistor 42 could be sized to conduct a current greater than the current conducted by transistor 22. In this embodiment the current conduction of transistors 18 and 42 would be greater than the current conduction of transistors 16 and 36.

Line 74 illustrates integrated demodulator tuning circuit 10 operating under the condition where the difference between the currents supplied at terminals 12 and 46 has a value that is above a set threshold value and the current supplied at input terminal 46 is greater than the value of the current supplied at input terminal 12.

In operation, the AFC signal supplied at output terminal 48 is used for adjusting the voltage on a filter capacitor (not shown) that controls an oscillator frequency in a demodulator. When the oscillator frequency is in tune the AFC signal can be disabled. Briefly referring to FIG. 3, the dead band, as illustrated by line 72, has been designed into integrated demodulator tuning circuit 10 for disabling the AFC signal. Now referring to FIG. 2, when the difference in currents supplied at terminals 12 and 46 has a value less than the set threshold value, transistors 20, 22 and 42 disable the current mirror formed by transistors 32 and 34 and transistors 38, 44 and 18 disable the current mirror formed by transistors 24 and 26. The dead band in the AFC current characteristic occurs when the current mirrors are disabled. The dead band is maintained until the difference in input currents reaches a threshold value in either polarity. The dead band preserves the frequency of the oscillator and allows integration of the filter capacitor.

Another method of tuning the oscillator frequency is to provide the injection-locked demodulator with an unmodulated signal at the carrier frequency of the modulated signal. Once the oscillator is tuned, the AFC signal is disabled and the injection-locked demodulator is provided with a modulated signal to demodulate. The AFC signal is disabled in the presence of the modulated signal to prevent detuning the injection-locked demodulator.

Figure 4:
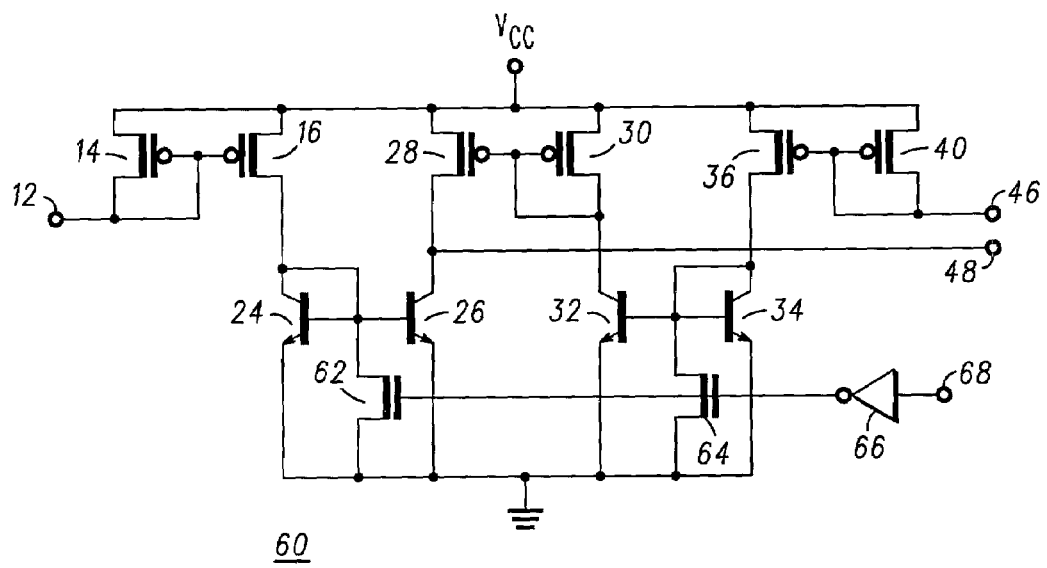
FIG. 4 is a circuit diagram of another embodiment for an integrated demodulator tuning circuit.

FIG. 4 is a circuit diagram of another embodiment of an integrated demodulator tuning circuit 60. It should be noted that integrated demodulator tuning circuit 60 could be substituted for demodulator tuning circuit 10 in FIG. 2. A differential input current is received at input terminals 12 and 46 and an output current provided at output terminal 48. Similar to the configuration shown in FIG. 2, the current received at input terminal 12 is mirrored in transistors 14 and 16 and again mirrored in transistors 24 and 26. Thus, transistors 14 and 16 and transistors 24 and 26 are configured to provide a current path from input terminal 12 to output terminal 48. Also similar to the configuration shown in FIG. 2, the current received at input terminal 46 is mirrored in transistors 36 and 40, and again mirrored in transistors 32 and 34, and mirrored yet again in transistors 28 and 30. Thus, current mirrors formed by transistors 36 and 40, 32 and 34, and 28 and 30 are configured to provide a current path from input terminal 46 to output terminal 48.

In comparing the embodiments shown in FIGS. 2 and 4, transistors 18, 20, 22, 38, 42 and 44 have been removed from the embodiment shown in FIG. 4 and transistors 62 and 64, along with inverter 66, have been added. Transistor 62 functions as a switch coupled between the commonly connected base terminals of transistors 24 and 26 and the ground power conductor. Transistor 64 functions as a switch coupled between the commonly connected base terminals of transistors 32 and 34 and the ground power conductor. Inverter 66 has an input connected to input terminal 68 and an output connected to the gate terminals of transistors 62 and 64.

In operation, referring to FIG. 4, integrated demodulator tuning circuit 60 shows separate current paths for the differential input current supplied at terminals 12 and 46 to the output current supplied from terminal 48. The current path from input terminal 12 to output terminal 48 follows the current mirror formed by transistors 14 and 16 through the current mirror formed by transistors 24 and 26. The current path from input terminal 46 to output terminal 48 is through the current mirror formed by transistors 36 and 40, then the current mirror formed by transistors 32 and 34, and finally by the current mirror formed by transistors 28 and 30. The output current at the AFC pin, i.e., output terminal 48, is a function of the difference in the differential input currents supplied at input terminals 12 and 46.

The AFC output signal in integrated demodulator tuning circuit 60 is enabled by a logic high signal for the signal ENABLE that is supplied at input terminal 68 When enabled, the output voltage at terminal 48 is a function of the difference in input currents supplied at terminals 12 and 46. A logic low signal, on the other hand, disables the AFC output signal. Specifically, a logic low signal supplied at input terminal 68 causes transistor 62 to be conductive, shutting off the current mirror formed by transistors 24 and 26 and disabling the current path from input terminal 12 to output terminal 48. Further, a logic low signal supplied at input terminal 68 causes transistor 64 to also be conductive, shutting off the current mirror formed by transistors 32 and 34 and disabling the current path from input terminal 46 to output terminal 48. Thus, the logic low signal at input terminal 68 switches the AFC signal off and the output current at terminal 48 does not respond to changes in the differential input current supplied at terminals 12 and 46. The AFC signal supplied by integrated demodulator tuning circuit 60 is used for setting a voltage on a tuning capacitor in filter 8 (see FIG. 1) that controls an oscillator frequency generated in a demodulator. While the AFC signal supplied from terminal 48 is switched off, charge is held on the tuning capacitor and the frequency of the oscillator in the demodulator is preserved.

By now it should be appreciated that an integrated demodulator tuning circuit has been shown that provides a circuit and method for generating a dead band in the AFC current characteristic and, in addition, a circuit and method for switching the generated AFC signal off and on. Both the circuitry for generating the dead band and the circuitry for switching the AFC signal on/off preserve the frequency of the oscillator, allow fast tuning without interfering with the modulation, and allow integration of the filter capacitor.

What is claimed is:

1. An injection-locked demodulator circuit with Automatic Frequency Control (AFC), comprising:
    an injection-locked oscillator having a first input for receiving a modulated signal;
    a multiplier having a first input for receiving the modulated signal and a second input for receiving a signal generated by the injection-locked oscillator;
    a tuning circuit coupled to an output of the multiplier for receiving first and second input signals, the tuning circuit disabling the AFC until a difference in the first and second input signals reaches a threshold value, the tuning circuit comprising:
        first and second current mirrors coupled between a first input terminal that receives the first input signal and the output of the tuning circuit, the first current mirror receiving a first current and the second current mirror providing a first portion of an output current;
        third, fourth and fifth current mirrors coupled between a second input terminal that receives the second input signal and the output terminal of the tuning circuit, the third current mirror receiving a second current and the fifth current mirror providing a second portion of the output current, wherein the first and second input terminals receive a differential signal from the multiplier; and
        first and second transistors coupled from inputs of the respective second and fourth current mirrors to a first power supply conductor for preventing the second current mirror from providing the first portion of the output current and the fifth current mirror from providing the second portion of the output current; and
    a filter having an input coupled to an output of the tuning circuit and an output coupled to a second input of the injection-locked oscillator.

2. The injection-locked demodulator circuit of claim 1, wherein the first current mirror comprises first and second P-channel MOS transistors having source terminals commonly coupled to a second power supply conductor and gate terminals commonly coupled to a drain terminal of the first P-channel MOS transistor and to the first input terminal.

3. The injection-locked demodulator circuit of claim 2, wherein the second current mirror comprises first and second NPN transistors having emitter terminals commonly coupled to the first power supply conductor and base terminals commonly coupled to a collector terminal of the first NPN transistor and to a drain terminal of the second P-channel MOS transistor.

4. The injection-locked demodulator circuit of claim 1, wherein the third current mirror comprises first and second P-channel MOS transistors having source terminals commonly coupled to a second power supply conductor and gate terminals commonly coupled to a drain terminal of the first P-channel transistor and to the second input terminal.

5. The injection-locked demodulator circuit of claim 4, wherein the fourth current mirror comprises first and second NPN transistors having emitter terminals commonly coupled to the first power supply conductor and base terminals commonly coupled to a collector of the second NPN transistor and to a drain of the second P-channel MOS transistor.

6. The injection-locked demodulator circuit of claim 5, wherein the fifth current mirror comprises third and fourth P-channel MOS transistors having source terminals commonly coupled to the second power supply conductor and gate terminals commonly coupled to a drain of the fourth P-channel MOS transistor and to a collector terminal of the first NPN transistor.

7. The injection-locked demodulator circuit of claim 1, wherein the AFC is enabled when the modulated signal has no data and disabled when the modulated signal has data.

8. The injection-locked demodulator circuit of claim 7, wherein the tuning circuit further includes another input for receiving a signal that controls when the AFC is enabled and disabled.

9. The injection-locked demodulator circuit of claim 1, wherein the tuning circuit further includes:
   a first switch coupled from an input of the second current mirror to a first power supply conductor and preventing the second current mirror from providing the first portion of the output current; and
   a second switch coupled from an input of the fourth current mirror to the first power supply conductor and preventing the fifth current mirror from providing the second portion of the output current at the output of the tuning circuit.

10. The injection-locked demodulator circuit of claim 9, wherein conduction of the first and second switches is controlled by the signal received at the another input of the tuning circuit.

11. A circuit for providing an automatic frequency control signal having first and second input terminals coupled for receiving a differential current and an output terminal that supplies a current that is a function of a difference of the differential current, the circuit comprising:
   a first current path from the first input terminal to the output terminal comprising first and second current mirrors coupled between the first input terminal and the output terminal of the circuit, the first current mirror receiving a first current and the second current mirror providing a first portion of the output current;
   a second current path from the second input terminal to the output terminal, the second current path comprising third, fourth and fifth current mirrors coupled between the second input terminal and the output terminal of the circuit, the third current mirror receiving a second current and the fifth current mirror providing a second portion of the output current; and
   first and second switches coupled for receiving a signal that disables the respective first and second current paths from providing the current that is the function of the difference of the differential current.

12. The circuit of claim 11, wherein the first and second switches are coupled from the respective second and fourth current mirrors to a first power supply conductor and prevent the second current mirror from providing the first portion of the output current and the fifth current mirror from providing the second portion of the output current that combine at the output terminal of the circuit to provide the function of the difference in the first and second currents.

13. A tuning circuit having first and second input terminals and generating an automated frequency control signal at an output terminal, comprising:
   first and second transistors that form a first current mirror and have first current conduction terminals commonly coupled to a first power supply conductor and control terminals commonly coupled to a second current conduction terminal of the first transistor and to the first input terminal;
   third and fourth transistors that form a second current mirror and have first current conduction terminals commonly coupled to a second power supply conductor and control terminals commonly coupled to a second conduction terminal of the third transistor and to a second current conduction terminal of the second transistor
   fifth and sixth transistors that form a third current mirror and have first current conduction terminals commonly coupled to the first power supply conductor and control terminals commonly coupled to a second current conduction terminal of the sixth transistor and to the second input terminal;
   seventh and eighth transistors that form a fourth current mirror and have first current conduction terminals commonly coupled to the second power supply conductor and control terminals commonly coupled to a second conduction terminal of the eighth transistor and to a second conduction terminal of the fifth transistor; and
   ninth and tenth transistors that form a fifth current mirror and have first current conduction terminals commonly coupled to the first power supply conductor and control terminals commonly coupled to a second conduction terminal of the tenth transistor and to a second conduction terminal of the seventh transistor, and the second conduction terminal of the ninth transistor being coupled to the output terminal of the tuning circuit.

14. The circuit of claim 13, further including:
   an eleventh transistor having a control terminal coupled to the first input terminal and a first conduction terminal coupled to the first power supply conductor; and
   a twelfth transistor having a control terminal and a first conduction terminal coupled to a second conduction terminal of the eleventh transistor and an second conduction terminal coupled to the second power supply conductor.

15. The circuit of claim 14, further including:
   an thirteenth transistor having a control terminal coupled to the second input terminal and a first conduction terminal coupled to the first power conductor; and
   a fourteenth transistor having a control terminal and a first conduction terminal coupled to a second conduction terminal of the thirteenth transistor and a second conduction terminal coupled to the second power supply conductor.

16. The circuit of claim 15, further including:
   a fifteenth transistor having a control terminal coupled to the control terminal of the fourteenth transistor, a first conduction terminal coupled to the second power supply conductor and a second conduction terminal coupled to the second conduction terminal of the second transistor; and
   a sixteenth transistor having a control terminal coupled to a control terminal of the twelfth transistor, a first conduction terminal coupled to the second power supply conductor and a second conduction terminal coupled to the second conduction terminal of the fifth transistor.

17. The circuit of claim 16, wherein scaling provides a current gain in a current signal path through the sixth, thirteenth, fourteenth and fifteenth transistors that exceeds a current gain in a current signal path through the first and second transistors, and a current gain in a current signal path through the first, eleventh, twelfth and sixteenth transistors exceeds a current signal path through the sixth and fifth transistors.

18. A method for generating an Automatic Frequency Control (AFC) signal having a dead band region where the AFC signal is not responsive to a difference in first and second input signals, comprising:

transferring a first signal received at a first input to an output through a first path;

transferring a second signal received at a second input to the output through a second path for combining with the first signal in generating the AFC signal; and exceeding a threshold in the AFC before generating the dead band region by transferring the first and second signals to the output.

19. A method for generating an Automatic Frequency Control (AFC) signal based on a modulated signal, comprising:

providing first and second input terminals for receiving a differential current;

providing an output terminal that supplies an output current that is a function of a difference of the differential current;

providing a first current path from the first input terminal to the output terminal;

coupling first and second current mirrors between the first input terminal and the output terminal, the first current mirror receiving the first current and the second current mirror providing a first portion of the output current;

providing a second current path from the second input terminal to the output terminal;

coupling third, fourth and fifth current mirrors between the second input terminal and the output terminal, the third current mirror receiving the second current and the fifth current mirror providing a second portion of the output current; and selectively disabling the first and second current paths from providing the output current.

20. A method for generating an Automatic Frequency Control (AFC) signal in an injection-locked demodulator, comprising:

providing the injection-locked demodulator with an unmodulated signal at the carrier frequency of the modulated signal;

providing the injection-locked demodulator with a modulated signal; and providing a differential current at first and second inputs;

coupling a plurality of current mirrors between the first and second inputs and an output terminal;

combining first and second current portions from the plurality of current mirrors to form an output current; and selectively disabling the output current and thereby disabling the AFC signal in the presence of the modulated signal to prevent detuning the injection-locked demodulator.

21. A method of generating an Automatic Frequency Control (AFC) signal having a deadband region in a demodulator, comprising:

transferring a first current signal received at a first input to an output through a first path;

transferring a second current signal received at a second input to the output through a second path for combining with the first signal in generating the AFC signal;

tuning the demodulator relative to a threshold value determined by relative sizes of transistors that form current mirrors in a tuning circuit of the demodulator; and maintaining the AFC signal in the dead band region until a difference in the first current signal and the second current signal exceeds the threshold value in either polarity upon which the AFC signal is serially passed to an AFC filter and an oscillator.

* * * * *

UNITED STATES PATENT AND TRADEMARK OFFICE
CERTIFICATE OF CORRECTION

PATENT NO. : 6,965,653 B2
APPLICATION NO. : 09/746277
DATED : November 15, 2005
INVENTOR(S) : William Eric Main et al.

It is certified that error appears in the above-identified patent and that said Letters Patent is hereby corrected as shown below:

Column 8, Line 32, Claim No. 14:
    Change "terminal of the eleventh transistor and an second" to --terminal of the eleventh transistor and a second--

Column 8, Line 36, Claim No. 15:
    Change "an thirteenth transistor having a control terminal coupled" to --a thirteenth transistor having a control terminal coupled--

Column 8, Line 38, Claim No. 15:
    Change "terminal coupled to the first power conductor;" to --terminal coupled to the first power supply conductor;--

Signed and Sealed this

Twenty-ninth Day of April, 2008

JON W. DUDAS
*Director of the United States Patent and Trademark Office*